US012796497B2

(12) United States Patent
Yoon et al.

(10) Patent No.: US 12,796,497 B2
(45) Date of Patent: Nov. 10, 2026

(54) METACONDUCTOR BASED COAXIAL TYPE RF DEVICES

(71) Applicant: University of Florida Research Foundation, Inc., Gainesville, FL (US)

(72) Inventors: Yong Kyu Yoon, Gainesville, FL (US); Saeyeong Jeon, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 328 days.

(21) Appl. No.: 18/676,964

(22) Filed: May 29, 2024

(65) Prior Publication Data

US 2024/0404933 A1 Dec. 5, 2024

Related U.S. Application Data

(60) Provisional application No. 63/504,862, filed on May 30, 2023.

(51) Int. Cl.

| | |
|---|---|
| ***H01L 23/498*** | (2006.01) |
| ***H01L 21/02*** | (2006.01) |
| ***H01L 23/66*** | (2006.01) |
| ***H10P 14/20*** | (2026.01) |
| ***H10W 44/20*** | (2026.01) |
| ***H10W 70/63*** | (2026.01) |
| ***H10W 70/65*** | (2026.01) |
| ***H10W 70/66*** | (2026.01) |

(52) U.S. Cl.

CPC ....... *H10W 70/635* (2026.01); *H10P 14/2922* (2026.01); *H10W 44/20* (2026.01); *H10W 70/65* (2026.01); *H10W 70/66* (2026.01)

(58) Field of Classification Search

CPC ... H10W 70/635; H10W 44/20; H10W 70/65; H10W 70/66; H10W 44/212; H10W 44/216; H10P 14/2922

See application file for complete search history.

(56) References Cited

U.S. PATENT DOCUMENTS

2020/0294685 A1* 9/2020 Bayes ..................... B32B 7/025

* cited by examiner

*Primary Examiner* — Leonardo Andujar

(74) *Attorney, Agent, or Firm* — Thomas | Horstemeyer, LLP

(57) ABSTRACT

The present disclosure describes various embodiments of systems, apparatuses, and related methods for a coaxial through-substrate-via (cx-TSV) based on a Cu/Co metaconductor. One such apparatus comprises a substrate; and a coaxial structure having an outer conductor and a metaconductor for its inner conductor, wherein the coaxial structure extends through the substrate.

20 Claims, 7 Drawing Sheets

METACONDUCTOR BASED COAXIAL TYPE RF DEVICES

CROSS-REFERENCE TO RELATED APPLICATION

This application claims priority to U.S. provisional application entitled, "Metaconductor Based Coaxial Type RF Devices," having application No. 63/504,862, filed May 30, 2023, which is entirely incorporated herein by reference.

STATEMENT REGARDING FEDERALLY SPONSORED RESEARCH OR DEVELOPMENT

This invention was made with government support under 2235978 awarded by the National Science Foundation. The government has certain rights in the invention.

BACKGROUND

The societal demand for higher communication speeds and data transfer rates has become the driving force behind the development of higher operational frequencies that can deliver extreme capacity, ultra-high throughput, and ultra-low latency. Therefore, operational frequencies have been pushed up to millimeter frequencies such as 28 GHz, 35 GHz, and 60 GHz for 5G technology and 100 GHz or higher for 6G technology.

The millimeter wave is the radio frequency spectrum between 30 and 300 GHz. Due to the higher operational frequencies compared to current 4G technology, it has faster data transmission speeds and higher bandwidth, enabling a hyper-real, hyper-connected, and hyper-intelligent service world. However, the usage of higher operational frequencies inevitably causes several problems, such as increased transmission losses, vulnerability to atmospheric interference (such as crosstalk and electromagnetic interference), and shorter traveling distances.

Dielectric and conductor losses are the main attenuation factors operating at higher frequencies, and conductor loss is dramatically increased due to the skin effect which is the tendency of high-frequency alternating current to flow in the outermost layer of the conductor. Thus, the effective cross-sectional area of the conductor for current flow is decreased, the radio frequency (RF) resistance is increased, and significant attenuation occurs.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
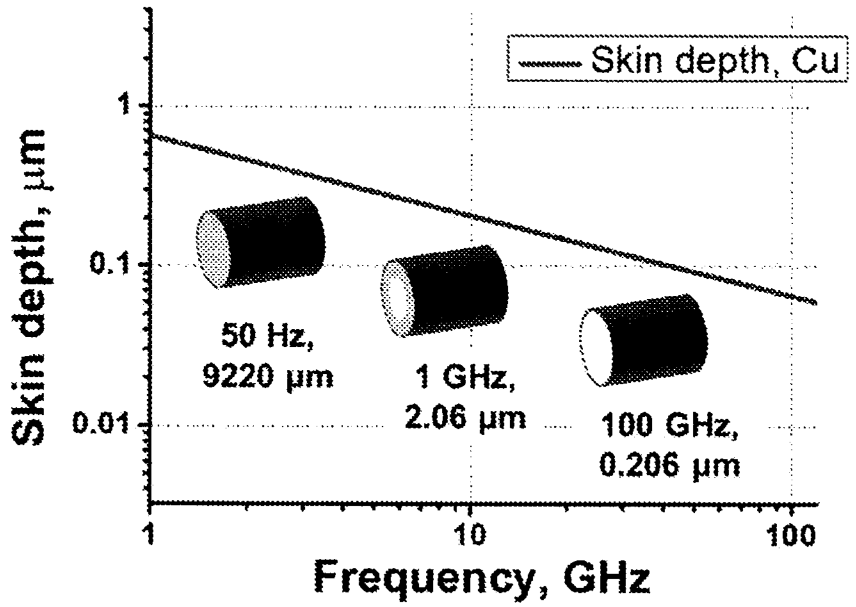
FIG. 1 is a chart showing calculated copper (Cu) skin depth at 50 Hz, 1 GHz, and 100 GHz with the resistivity of $1.68\times10^{-8}$ Ω·m and the relative magnetic permeability of 0.9999991.

The present disclosure describes various embodiments of systems, apparatuses, and related methods for a coaxial through-substrate-via (cx-TSV) based on a Cu/Co metaconductor, which exhibits low radio frequency (RF) loss and good electromagnetic interference (EMI) immunity, thereby ensuring high signal and power integrity and reliable system packaging for millimeter wave applications. The low loss is attributed to the metaconductor configuration, while the cx-TSV ensures EMI immunity and reliability.

In accordance with the present disclosure, a metaconductor, containing non-ferromagnetic and ferromagnetic material, has shown superior RF performance by suppressing the skin effect and reducing RF resistance. The effectiveness of the metaconductor has been proven for the last two decades. In particular, for millimeter wave applications, Cu/Co metaconductor-based planar-type RF passive devices have shown a 50% RF resistance reduction at 28 GHz. Additionally, a 3D type of cylindrical radial superlattice structure-based airlifted metaconductor inductor has been studied with 70% resistance reduction at 45 GHz. Conformally coated metaconductor wires can be actively utilized not only for interconnecting bonding wires but also for any applications using wires, such as coaxial cables. The coaxial architecture, having a cylindrical metal conductor surrounded by a cylindrical dielectric layer, which is then surrounded by a second cylindrical metal conductor, is especially useful to minimize interference from external RF sources.

As the operating frequency increases, its characteristic dimension decreases. For example, a quarter wavelength of many cases is comparable to the thickness of a substrate. This allows through-substrate-vias (TSVs) to serve as a resonant monopole antenna or electrically small antenna, leading to vulnerability to external intentional or unintentional signal interference and/or serving as an unwanted backdoor to signal leakage. Therefore, the cx-TSVs architecture, which can improve electrical performance by reducing the resistance and capacitance of the interconnects and improve signal integrity and reliability by providing better signal protection, can be accommodated for future 5G and 6G packaging systems.

In accordance with various embodiments of the present disclosure, a Cu/Co metaconductor-based low-loss cx-TSV can be utilized for millimeter wave applications. As a test vehicle to show its RF performances, a cx-TSV with a superlattice Cu/Co metaconductor for its inner conductor is designed and simulated using the High Frequency Structure Simulator (HFSS, 2022 R1, ANSYS Inc.). RF performances are analyzed across the frequency range of 1-50 GHz, and the impedance is matched to 50Ω. In comparison to the solid Cu TSV, the use of the Cu/Co metaconductor for the inner conductor of the cx-TSV results in a significant improvement in the insertion loss, with a reduction of 0.39 dB/mm, as well as an improvement in isolation of 18 dB at a frequency of 33 GHz.

As previously discussed, the skin effect is a phenomenon in which high frequency AC current flows primarily on the surface of a conductor, rather than uniformly throughout the cross-section. This is caused by the changing magnetic field created by the signal, which induces eddy currents in the conductor that generate their own magnetic field. The interaction of these fields causes the signal to be confined to the outer layer of the conductor. The skin effect results in increased RF resistance, leading to power loss, heat generation, and decreased RF performance in high frequency applications. As a result, the signal and power integrity can be deteriorated. The skin depth is defined as the depth of the skin effect and can be calculated using the formula:

$$\delta = \frac{1}{\sqrt{\pi f \mu \sigma}} \tag{1}$$

where σ is the electrical conductivity, μ is the magnetic permeability of the conductor, and f is the operational frequency. FIG. 1 shows the calculated skin depth as a function of the operating frequency. The calculated Cu skin depths are 9,220 μm, 2.06 μm, and 0.206 μm for operation frequencies of 50 Hz, 1 GHz, and 100 GHz, respectively. The skin depth decreases exponentially, which exacerbates the skin effect at higher frequencies. While there are several approaches to minimize the effects of the skin effect, such as using stranded wires, tubular conductors, or a higher conductivity material, these methods are not quite effective at high frequencies.

In accordance with the present disclosure, a metaconductor is an engineered material with alternating thin layers of non-ferromagnetic materials such as Cu, Au, Al, and Ag, and ferromagnetic materials such as Ni, Co, Fe, and their alloys. The thickness of each layer is typically in the nanometer range and smaller than the skin depth at the operating frequency of millimeter waves.

The interaction between the ferromagnetic and non-ferromagnetic materials in the metaconductor creates unique electromagnetic properties not found in natural materials. Specifically, the positive and negative relative permeabilities of each material at the operating frequency play a crucial role in shaping the effective permeability of the structure, enabling new possibilities for device design and function. The relative permeability of metal is a measure of its ability to magnetize in response to an external magnetic field. In conventional non-magnetic conductors, this relative permeability is positive, meaning that the metal will respond to a magnetic field by generating its own magnetic field in the opposite direction. This can cause eddy currents and other effects that lead to signal loss and noise issues.

In a ferromagnetic metal, on the other hand, the relative magnetic permeability can be negative, which means that it will respond to a magnetic field by generating a magnetic field in the same direction. In general, ferromagnetic materials exhibit positive magnetic permeability at low frequencies due to their magnetic properties. However, at high frequencies, they can exhibit negative permeability in specific frequency ranges, which is above the ferromagnetic resonance (FMR) frequency. FMR is a resonant phenomenon that occurs when the precession frequency of the magnetic moments in a ferromagnetic material matches the frequency of an applied electromagnetic wave, resulting in a strong magnetic response and increased absorption of the electromagnetic wave by the material. The dynamic response of the relative magnetic permeability of the ferromagnetic material can be extracted by solving the Landau-Lifshitz-Gilbert (LLG) equation, which describes the motion of magnetization in a ferromagnetic material.

Thus, the negative relative magnetic permeability of the ferromagnetic material can counterbalance the positive magnetic permeability of the non-ferromagnetic material, resulting in a near-zero or significantly smaller effective magnetic permeability within the metaconductor. This leads to the suppression of the skin effect, greatly increasing the skin depth, and thus results in a quite even distribution of current density, greatly reducing conductor loss and RF resistance at the operating frequency. Depending on the thickness and the choice of metals, the effective magnetic permeability of the metaconductor can be tuned to specific values at the operating frequency. Using HFSS software that simulates electromagnetic behavior in three dimensions, the effectiveness of a coaxial configuration in reducing signal attenuation and crosstalk can be demonstrated, as well as the effectiveness of using a Cu/Co metaconductor in reducing the skin effect and improving RF performance compared to using a standard copper conductor.

Figure 2A:
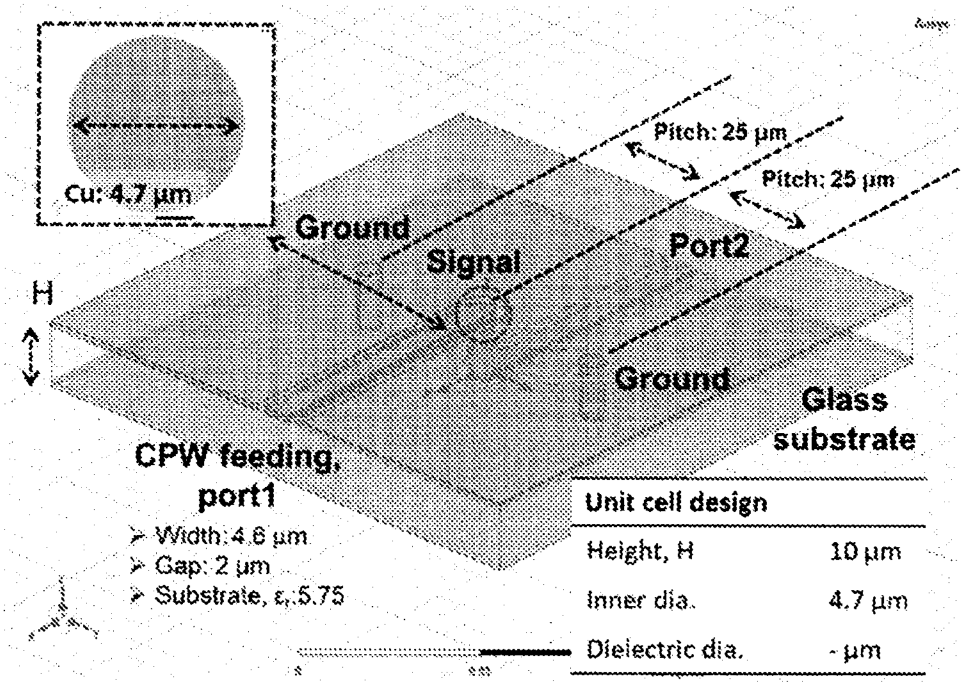
FIG. 2A shows a schematic of a designed Ground-Signal-Ground (GSG) TSV including a solid Cu signal line.
Figure 2B:
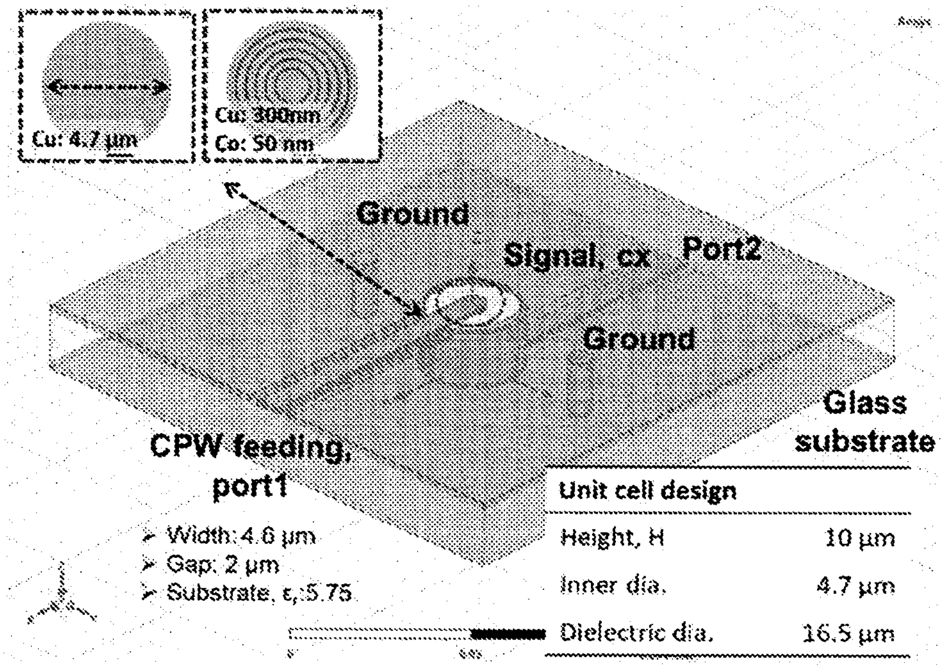
FIG. 2B shows a schematic of a designed GSG cx-TSVs including a solid Cu signal line and a Cu/Co metaconductor signal line in accordance with various embodiments of the present disclosure.
Figure 2C:
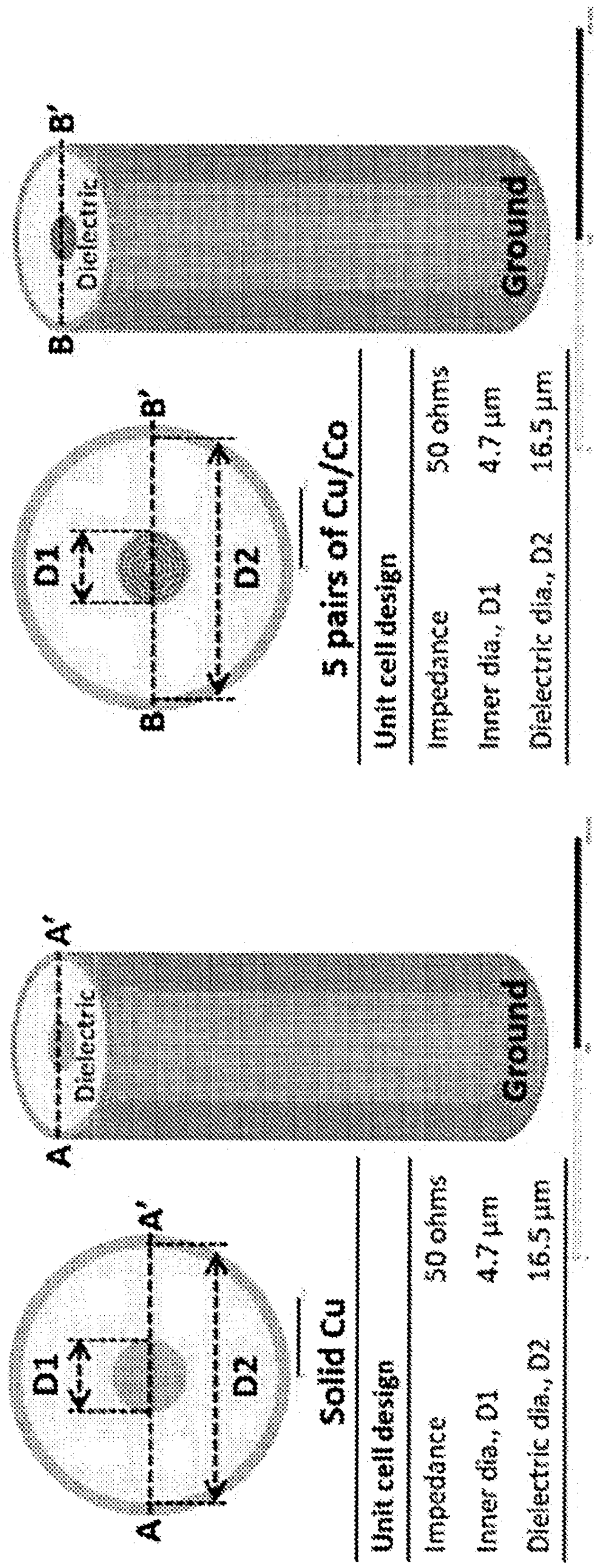
FIG. 2C shows structure designs of cx-TSVs of FIG. 2B.

FIG. 2A depicts a schematic of a designed Ground-Signal-Ground (GSG) TSV, including a solid Cu signal line, and FIG. 2B depicts a schematic of a designed GSG cx-TSVs, including a solid Cu signal line and a Cu/Co metaconductor signal line. A glass substrate with a height of 10 μm and a dielectric constant of 5.75 is used and 50Ω matched coplanar waveguide (CPW) feeding lines are utilized with a width of 4.6 μm and a gap of 2 μm. Both the top and bottom of the substrate are grounded. The GSG structure is separated by a pitch of 25 μm and the signal lines of both TSVs and cx-TSVs have a diameter of 4.7 μm. The designed cx-TSVs are shown in FIG. 2C with the left side of the figure showing the cx-TSV with a solid Cu signal line and the right side of the figure showing the cx-TSV with a Cu/Co metaconductor signal line.

The cx-TSV based on a Cu/Co metaconductor has an internal conductor diameter of 4.7 μm which is identical to that of the solid Cu cx-TSV, made up of 5 pairs of alternating layers of 300 nm Cu and 50 nm Co. It also has a dielectric layer diameter of 16.5 μm, with a dielectric constant of 2.25 and a unit cell length of 10 μm. The cut-off frequency and the impedance of the cx-TSV are 6.0 THz and 50Ω, respectively.

Figure 3:
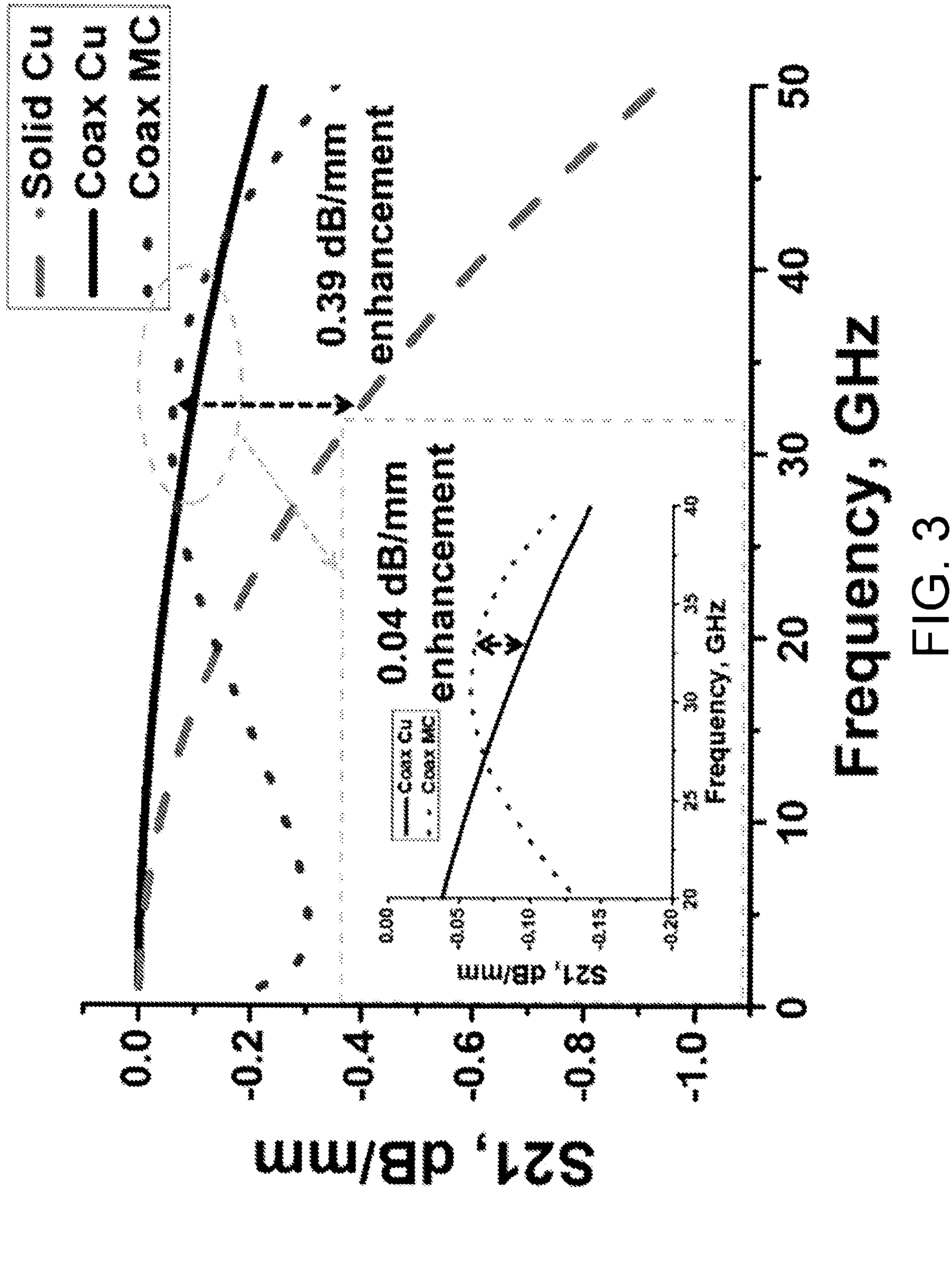
FIG. 3 shows a comparison plot of the magnitude of insertion loss (S21) for the three types of TSVs: a solid Cu GSG TSV, a solid Cu GSG cx-TSV, and the Cu/Co metaconductor GSG cx-TSV of the present disclosure.
Figure 4A:
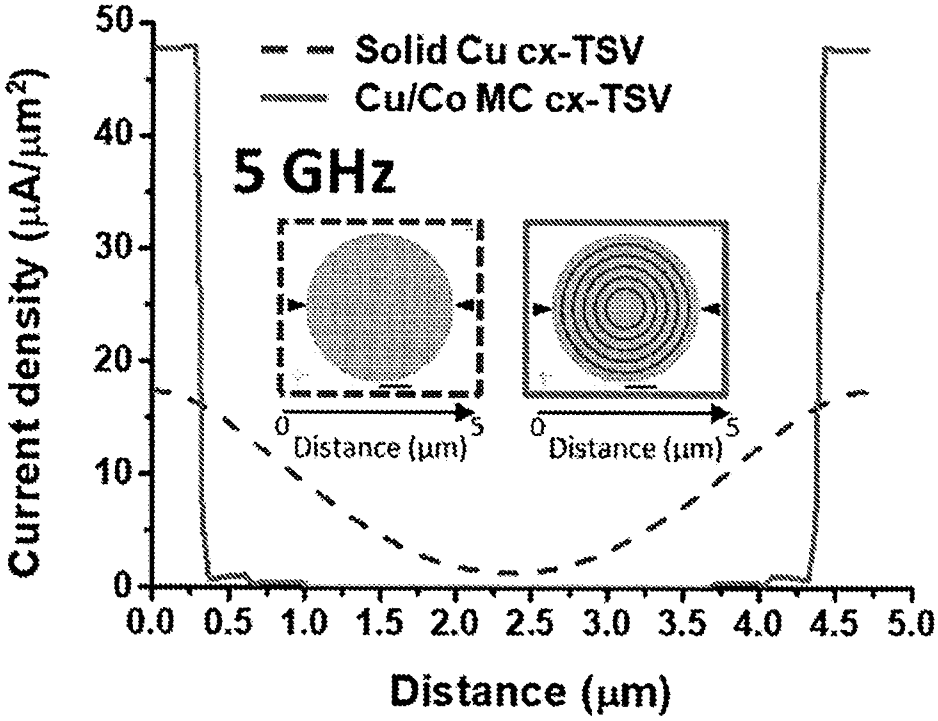
FIGS. 4A-4D show current distribution profile through the volume of the solid Cu and Cu/Co metaconductor cx-TSVs at 5 GHz, 15 GHz, 33 GHz, and 45 GHz, respectively.
Figure 4B:
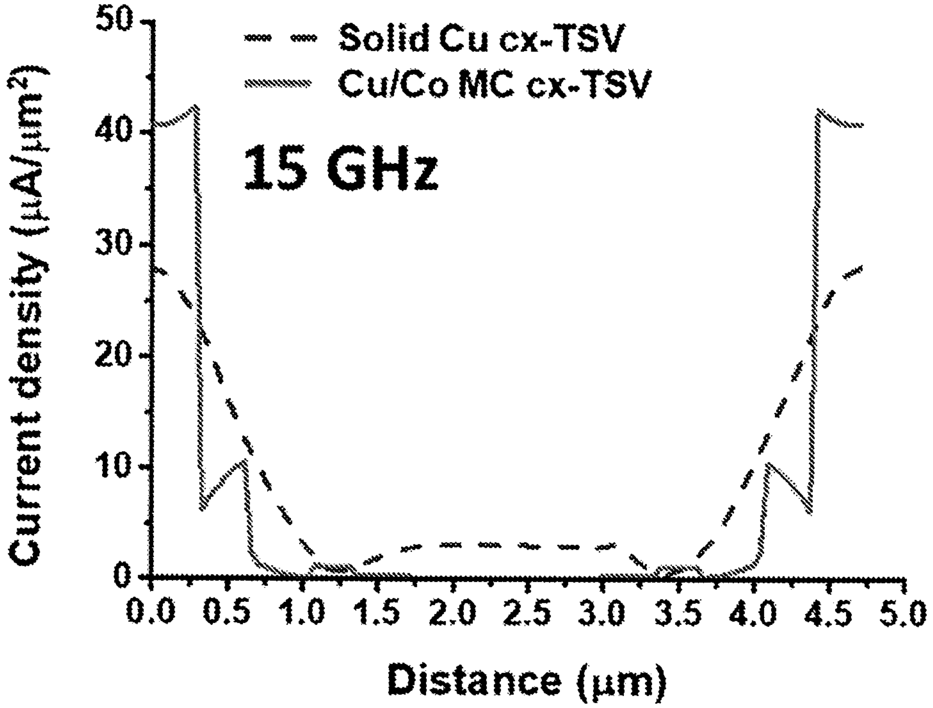
Figure 4C:
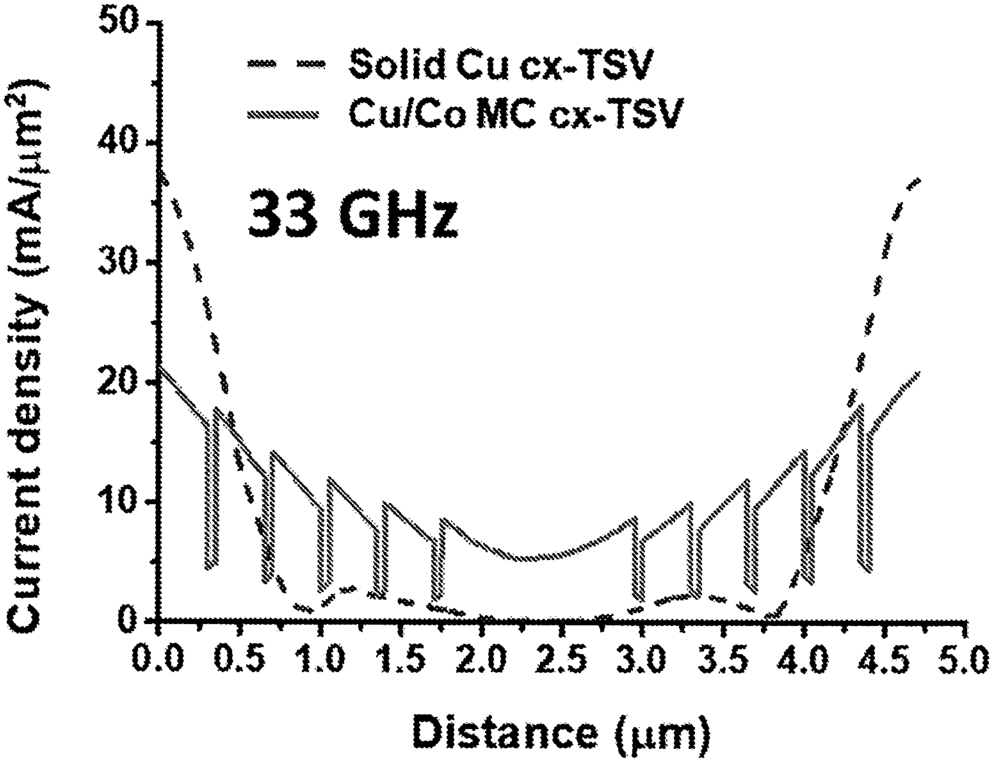
Figure 4D:
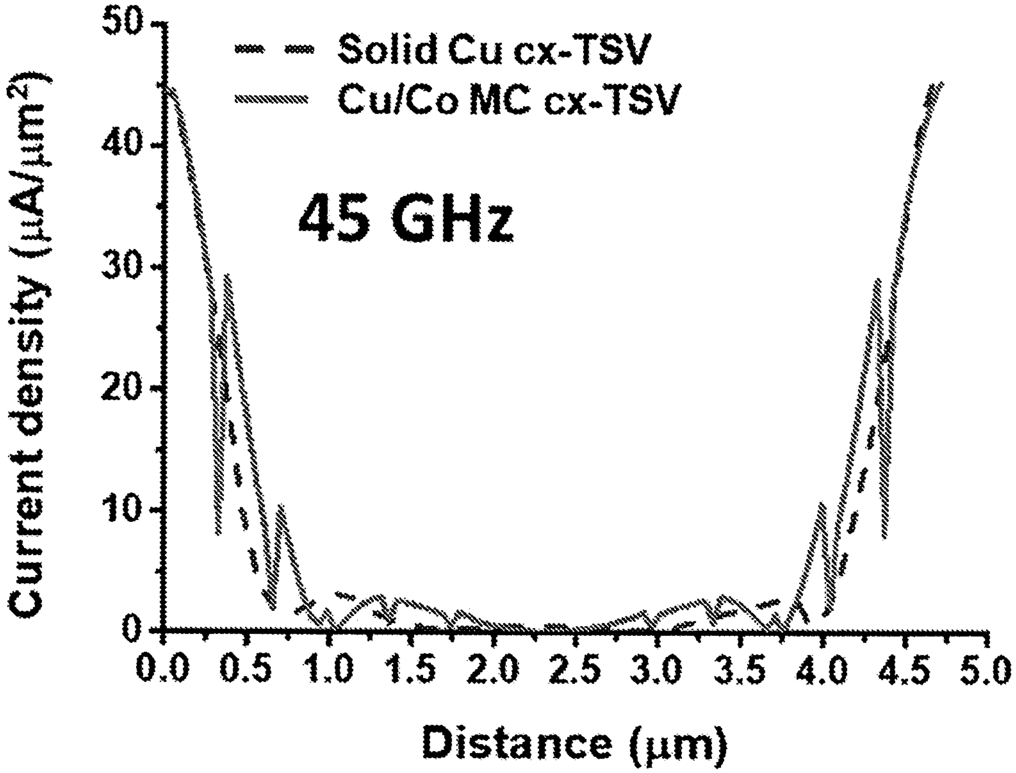

Using HFSS software that simulates electromagnetic behavior in three dimensions, the effectiveness of a coaxial configuration in reducing signal attenuation and crosstalk can be demonstrated, as well as the effectiveness of using a Cu/Co metaconductor in reducing the skin effect and improving RF performance compared to using a standard copper conductor. Accordingly, FIG. 3 shows a comparison plot of the magnitude of insertion loss (S21) for three types of TSVs: solid Cu GSG TSV, solid Cu GSG cx-TSV, and Cu/Co metaconductor GSG cx-TSV. At 33 GHz, insertion loss values of 0.459 dB/mm, 0.111 dB/mm, and 0.071 dB/mm are obtained for the solid Cu GSG TSV, solid Cu GSG cx-TSV, and Cu/Co metaconductor GSG cx-TSV, respectively. The Cu/Co metaconductor cx-TSV shows a remarkable improvement in S21, with an enhancement of 0.39 dB/mm compared to the solid Cu TSV, and it also shows an improvement of 0.04 dB/mm when compared to the solid Cu cx-TSV. The simulation results indicate that the use of a coaxial configuration in TSV design can effectively suppress unwanted substrate loss and provide good impedance matching.

Moreover, by integrating a metaconductor configuration in the TSV design, the skin effect can be minimized, which in turn, further reduces signal loss. As shown in FIGS. 4A-4D, the current distribution profile through the volume of the solid Cu and Cu/Co metaconductor cx-TSVs at different frequencies: (A) 5 GHz, (B) 15 GHz, (C) 33 GHz, and (D) 45 GHz, confirms the reduced skin effect through the metaconductor structure. Specifically, the Cu/Co metaconductor shows an enlarged skin depth at 33 GHz, resulting in a correspondingly reduced insertion loss. This finding highlights the effectiveness of the metaconductor configuration in minimizing signal loss and improving signal integrity. Overall, the results indicate that using coaxial and metaconductor configurations can significantly improve the performance of TSVs by minimizing unwanted losses and providing better signal integrity.

Figure 5:
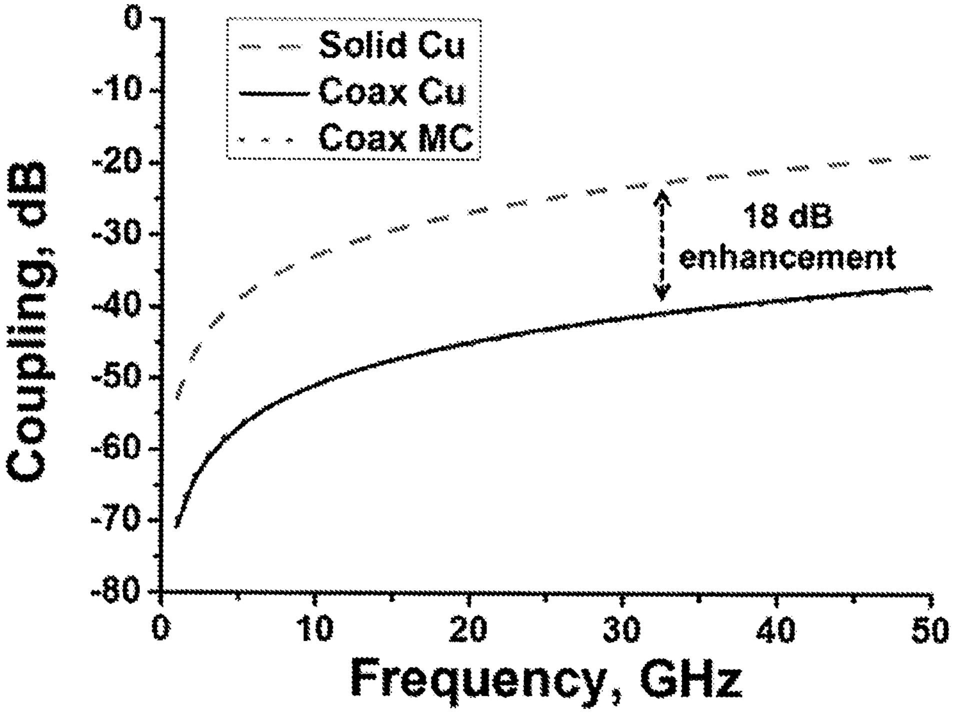
FIG. 5 is a chart showing coupling magnitude of the solid Cu GSG TSV, the solid Cu GSG cx-TSV, and the Cu/Co metaconductor GSG cx-TSV between adjacent ports.

Also, to verify the effectiveness of the coaxial configuration in minimizing coupling and enhancing electromagnetic interference immunity between adjacent ports, simulations are conducted to measure the coupling magnitude of the solid Cu TSV, the solid Cu cx-TSV, and the Cu/Co metaconductor cx-TSV. Two instances of each device were used, with the same dimensions as the aforementioned devices and 4 ports of 50Ω matched CPW feed lines with a pitch of 30 μm. The results of the coupling simulation are shown in FIG. 5. Notably, the coaxial devices show significantly better isolation with an 18 dB enhancement across all frequencies, suggesting the device pitch can be miniaturized using the coaxial configuration, thus increasing device density with low signal coupling and improved electromagnetic interference immunity.

In conclusion, for the first time, a Cu/Co metaconductor-based low-loss cx-TSV has been presented for millimeter wave applications. To demonstrate its RF performance, a cx-TSV with a superlattice Cu/Co metaconductor for the inner conductor has been designed and simulated using HFSS. The present disclosure has analyzed the RF performance across the frequency range of 1-50 GHz and matched the impedance to 50Ω. Compared to a solid Cu TSV, the use of the Cu/Co metaconductor for the inner conductor of the cx-TSV has resulted in a significant reduction in insertion loss, with a decrease of 0.39 dB/mm, as well as an improvement in isolation by 18 dB at a frequency of 33 GHz. These findings show the capabilities of the disclosed design for advanced applications requiring high performance and reliability at millimeter-wave frequencies.

In accordance with the present disclosure, one beneficial application, among others, involves High-Bandwidth Memory (HBM). HBM is a stacked memory technology that uses 3D stacking technology and microscopic interconnecting wires called "through-silicon vias" (TSVs). HBM is designed for use in high-performance computing applications that require data speed, such as graphics cards and GPUs. HBM offers several key advantages over traditional memory technologies, such as high bandwidth and lower power consumption. Accordingly, HBM boasts significantly higher bandwidth compared to DDR memory, enabling faster data transfer between the processor and memory, crucial for data-intensive tasks. Additionally, due to its stacked architecture and shorter signal paths, HBM consumes less power than DDR, translating to improved energy efficiency, especially important for portable devices and data centers. The stacked design of HBM also allows for a smaller footprint compared to traditional memory modules, leading to more compact and efficient device designs.

In accordance with the present disclosure, cx-TSVs with Cu/Co metaconductor exhibit significantly lower insertion loss compared to traditional solid Cu designs. This directly translates to less signal degradation within the HBM stack, potentially leading to: higher data transfer rates as reduced signal loss allows for faster data transmission within the HBM, potentially improving overall system performance; lower power consumption as reduced signal loss also means less energy is needed to transmit data, potentially resulting in lower power consumption for the HBM stack; improved EMI immunity as the coaxial configuration of the cx-TSVs offers better isolation from external electromagnetic interference (EMI), which can be crucial for HBM in environments with high noise levels—This improved immunity can help ensure reliable data transmission and prevent errors; and miniaturization potential as the use of cx-TSVs could allow for miniaturization of devices due to their reduced pitch and improved isolation. This could be beneficial for HBM in applications where space is limited, such as in high-performance mobile devices.

Another beneficial application, among others, involves high-frequency antenna systems, such as those involving millimeter wave phased arrays and satellite communications. For millimeter wave phased arrays, cx-TSVs can enable efficient signal routing between antenna elements in phased arrays used for radar, imaging, and communication systems at millimeter wave frequencies. Their low loss and good EMI immunity would be crucial for maintaining signal integrity and system performance. While existing solutions (microstrip lines, waveguides) suffer from higher losses and coupling at these frequencies and phased arrays require precise control of phase and amplitude across numerous antenna elements, cx-TSVs' low loss and good EMI immunity ensure signal integrity, leading to accurate beam steering and high gain at millimeter wave frequencies. Example uses for such technologies include radar systems, imaging systems, 5G/6G communication systems. Additionally, for satellite communications, cx-TSVs can be used in satellite transceivers operating at millimeter wave frequencies, contributing to improved data transfer rates and reduced power consumption. While satellites demand compact, lightweight components with low power consumption, cx-TSVs offer reduced size and weight due to their coaxial structure and potentially lower power needs compared to traditional solutions. Example uses for such technologies include satellite transceivers operating at Ka/V/W bands for high data rate communication.

It should be emphasized that the above-described embodiments are merely possible examples of implementations, merely set forth for a clear understanding of the principles of the present disclosure. Many variations and modifications may be made to the above-described embodiment(s) without departing substantially from the principles of the present disclosure. All such modifications and variations are intended to be included herein within the scope of this disclosure.

The invention claimed is:

1. A coaxial through-substrate via comprising:

a substrate; and a coaxial structure having an outer conductor and a metaconductor for its inner conductor, wherein the coaxial structure extends through the substrate to form an antenna or an interconnecting wire, wherein the metaconductor consists of alternating layers of non-ferromagnetic materials and ferromagnetic materials.

2. The coaxial through-substrate via of claim 1, wherein the substrate comprises a glass substrate, the outer conductor comprises a copper conductor, and the inner conductor comprises a Cu/Co metaconductor.

3. The coaxial through-substrate via of claim 2, wherein a top and a bottom of the glass substrate are grounded.

4. The coaxial through-substrate via of claim 2, wherein the metaconductor comprises 5 pairs of alternating layers of Cu and Co.

5. The coaxial through-substrate via of claim 1, wherein the non-ferromagnetic materials comprise Cu, Au, Al, or Ag.

6. The coaxial through-substrate via of claim 5, wherein the ferromagnetic materials comprise Ni, Co, Fe, or their alloys.

7. The coaxial through-substrate via of claim 1, wherein a thickness of each layer of the metaconductor is smaller than a skin depth at an operating frequency of millimeter waves.

8. The coaxial through-substrate via of claim 7, wherein an effective magnetic permeability of the metaconductor comprises a specific value at the operating frequency.

9. The coaxial through-substrate via of claim 1, wherein the coaxial structure extending through the substrate acts as a radiating portion of a monopole antenna.

10. The coaxial through-substrate via of claim 1, wherein the substrate comprises a glass substrate.

11. A method comprising:

surrounding a first cylindrical metal conductor with a cylindrical dielectric layer, wherein the first cylindrical metal conductor comprises a superlattice of non-ferromagnetic materials and ferromagnetic materials in alternating layers to form a metaconductor;

surrounding the cylindrical dielectric layer with a second cylindrical metal conductor to form a coaxial structure;

extending the coaxial structure through a substrate to form an antenna or an interconnecting wire.

12. The method of claim 11, wherein the substrate comprises a glass substrate, the first cylindrical metal conductor comprises a Cu/Co metaconductor and the second cylindrical metal conductor consists of Cu.

13. The method of claim 12, further comprising grounding a top and a bottom of the glass substrate.

14. The method of claim 12, wherein the metaconductor comprises 5 pairs of alternating layers of Cu and Co.

15. The method of claim 11, wherein the non-ferromagnetic materials comprise Cu, Au, Al, or Ag.

16. The method of claim 15, wherein the ferromagnetic materials comprise Ni, Co, Fe, or their alloys.

17. The method of claim 11, wherein a thickness of each layer of the metaconductor is smaller than a skin depth at an operating frequency of millimeter waves.

18. The method of claim 17, further comprising tuning an effective magnetic permeability of the metaconductor to a specific value at the operating frequency.

19. The method of claim 11, wherein the coaxial structure extending through the substrate acts as a radiating portion of a monopole antenna.

20. The method of claim 11, wherein the substrate comprises a glass substrate.

* * * * *